(12) United States Patent
Gregory

(10) Patent No.: US 6,225,181 B1
(45) Date of Patent: May 1, 2001

(54) TRENCH ISOLATED BIPOLAR TRANSISTOR STRUCTURE INTEGRATED WITH CMOS TECHNOLOGY

(75) Inventor: Haydn James Gregory, Palo Alto, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/294,124

(22) Filed: Apr. 19, 1999

(51) Int. Cl.[7] .................................................. H01L 21/331
(52) U.S. Cl. ..................... 438/355; 438/353; 438/356; 438/357; 438/416
(58) Field of Search .................. 438/414, 416, 438/418, 353, 355, 356, 357

(56) References Cited

U.S. PATENT DOCUMENTS

| | | | |
|---|---|---|---|
| 4,452,645 | 6/1984 | Chu et al. | 148/1.5 |
| 4,662,062 | 5/1987 | Toyooka et al. | 29/578 |
| 4,710,241 | 12/1987 | Komatsu | 437/162 |
| 4,713,355 | 12/1987 | Gardner | 437/31 |
| 4,745,087 | 5/1988 | Iranmanesh | 437/69 |
| 5,055,419 | 10/1991 | Scovell et al. | 437/31 |
| 5,444,004 | 8/1995 | Jang | 437/31 |
| 5,580,798 | 12/1996 | Grubisich | 437/34 |
| 5,643,809 | 7/1997 | Lien | 437/31 |
| 5,679,587 | * 10/1997 | Zambrano . | |
| 5,688,702 | * 11/1997 | Nakagawa et al. . | |
| 5,698,459 | 12/1997 | Grubisich | 437/31 |
| 5,759,902 | * 6/1998 | Lapham et al. | 438/322 |
| 5,895,249 | * 4/1999 | Zambrano et al. | 438/356 |
| 5,942,783 | * 8/1999 | Brambilla et al. | 257/372 |
| 5,976,940 | * 11/1999 | Gomi et al. | 438/340 |

* cited by examiner

*Primary Examiner*—Trung Dang
(74) *Attorney, Agent, or Firm*—Stallman & Pollock LLP

(57) ABSTRACT

A bipolar transistor is vertically isolated from underlying silicon by an isolation layer of conductivity type opposite that of the collector. This isolation layer lies beneath the heavily doped buried layer portion of the collector, and is formed either by ion implantation prior to epitaxial growth of well regions, or by high energy ion implantation into the substrate prior to formation of the well and the heavily doped buried collector layer. Utilization of trench lateral isolation extending into the semiconductor material beyond the isolation layer permits blanket implant of the isolation layer, obviating the need for an additional masking step.

10 Claims, 5 Drawing Sheets

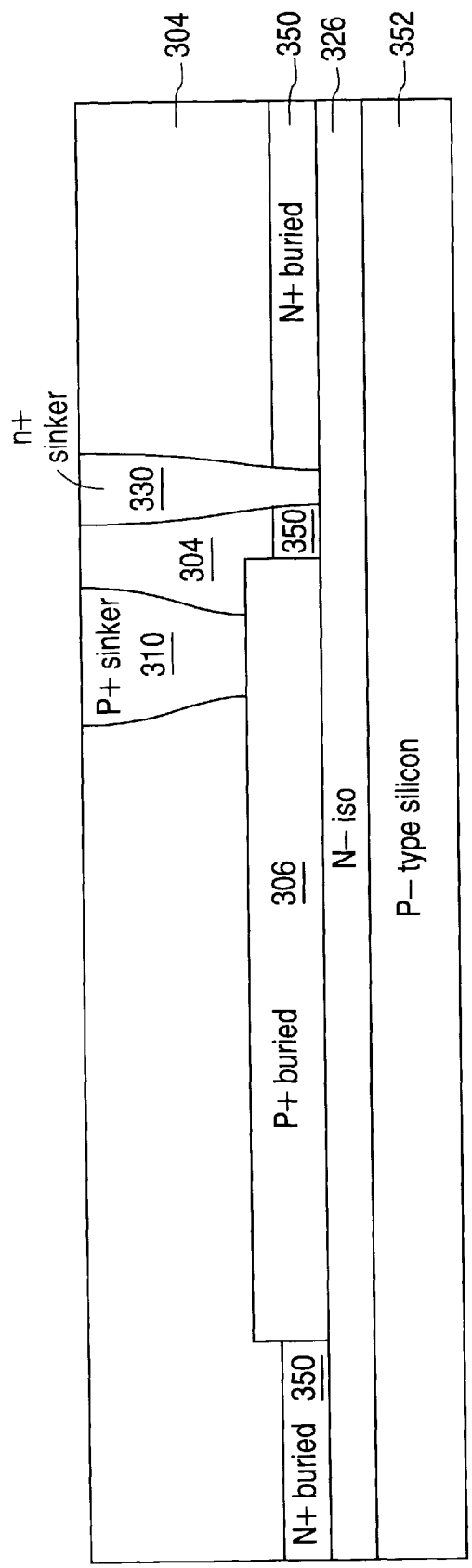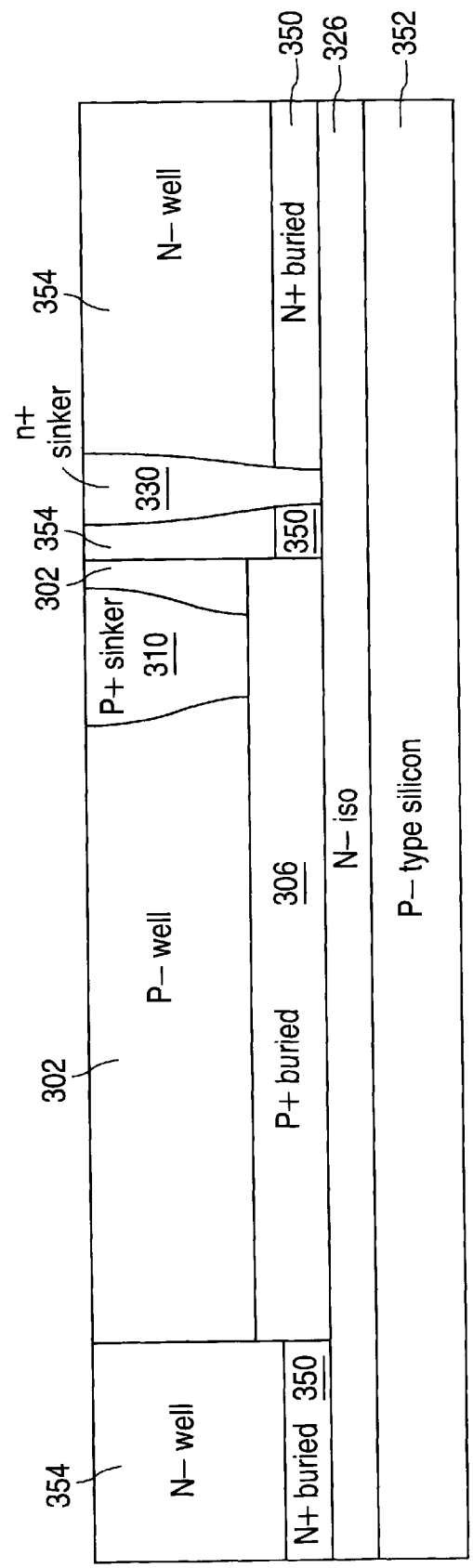
FIG. 4C
FIG. 4D

TRENCH ISOLATED BIPOLAR TRANSISTOR STRUCTURE INTEGRATED WITH CMOS TECHNOLOGY

BACKGROUND OF THE INVENTION

1. Field of the Invention

The present invention relates to a bipolar transistor design, and, in particular, to a process for forming a vertically isolated bipolar device that can be incorporated into a CMOS process flow with a minimum number of additional steps.

2. Discussion of the Related Art

FIG. 1 shows a cross-sectional view of a conventional vertical PNP bipolar transistor structure. Conventional PNP bipolar transistor structure 100 is formed in P-well 102. P-well 102 is created within P-type silicon substrate 104. The collector of bipolar transistor 100 is formed by P-well 102 and buried P+ layer 106. Buried P+ layer 106 is connected to collector contact 108 by P+ sinker structure 110. Collector contact 108 and P+ sinker 110 are electrically isolated from the base and emitter by intra-device isolation structure 112.

The base of bipolar transistor 100 is formed by N-type layer 114 having N+ base contact region 116. N+ base contact region 116 is self-aligned to oxide spacer 118 formed on sidewall 120a of extrinsic P+ polysilicon emitter 120. Polysilicon emitter contact component 120b of diffused polysilicon emitter structure 120 overlies P+ single crystal emitter component 120c. Polysilicon emitter contact component 120b of diffused polysilicon emitter 120 is separated from base 114 by dielectric layer 124.

Older IC designs tended to use only bipolar transistors of the same type, for example exclusively PNP or NPN. In such circuits, it was possible for the transistors to share a common collector biased at a constant value. However, the ever-increasing demand for faster processing speeds and enhanced flexibility has dictated that PNP and NPN bipolar transistors be utilized together in the same circuit, and that they be employed in conjunction with MOS transistors. As a result, it has become increasingly important to electrically isolate individual bipolar devices formed within the same silicon substrate.

One way of providing such isolation is through silicon-on-insulator (SOI) technology. FIG. 2 shows a vertical PNP bipolar transistor 200 formed in an SOI isolation scheme.

PNP bipolar transistor 200 is similar to bipolar transistor 100 of FIG. 1, except bipolar transistor 200 is laterally isolated from adjacent semiconducting devices by dielectric-filled trenches 202. PNP bipolar transistor 200 is vertically isolated from underlying P-type silicon 204 by buried oxide layer 206.

SOI isolated bipolar transistor 200 of FIG. 2 is suitable for a number of applications. However, this design suffers from the serious disadvantage of being relatively difficult and expensive to fabricate. Specifically, formation of buried oxide layer 206 within underlying P-type silicon 204 entails complex processing steps which substantially elevate cost.

One way of forming buried oxide layer 206 is high-energy ion implantation of oxygen into the underlying silicon, followed by oxidation. The expense of this step is attributable to the complex ion implantation equipment required, and the difficulty of ensuring complete oxidation deep within the silicon.

An alternative way of forming the buried oxide layer is to join oxide surfaces of two separate silicon wafers, and then remove backside silicon of one of the wafers to produce a surface suitable for epitaxial growth. The high cost of this process is associated with the difficulty in effectively bonding together the oxide surfaces to form an single integrated wafer structure that is substantially free of defects.

Many other methods exist for forming a buried oxide layer in addition to the those specifically described above. However, these processes are also fraught with the potential for error, resulting in increased defect densities and high production costs.

Therefore, it is desirable to utilize a process flow for forming a vertically isolated bipolar transistor device compatible with CMOS processes which minimizes both the number and cost of additional processing steps.

SUMMARY OF THE INVENTION

The present invention proposes a vertically isolated bipolar transistor structure, and a process flow for forming that structure, which utilizes a an implanted isolation layer formed underneath the collector. This vertical junction isolation scheme eliminates processing hurdles inherent in formation of a buried oxide layer between the collector and the underlying silicon. When employed in conjunction with trench lateral isolation, the isolation layer may be formed as a blanket implant, thereby avoiding a masking step.

A method of electronically isolating a bipolar transistor device from an underlying semiconductor material in accordance with the present invention comprises providing an isolation layer of dopant of a first conductivity type in the semiconductor material underneath a collector of a second conductivity type opposite the first conductivity type.

A process flow for forming a bipolar structure in accordance with one embodiment of the present invention comprises the steps of performing an isolation implant of dopant of a first conductivity type into a semiconductor substrate to form an isolation layer, and then thermally driving the isolation implanted dopant into the substrate. Next, a first masked buried layer implant of dopant of the first conductivity type into the semiconductor substrate to form a first buried layer is performed. A second masked buried layer implant of dopant of the second conductivity type into the semiconductor substrate outside of the first buried layer to form a second buried layer is then performed. Additional lightly doped semiconductor material of the first conductivity type is created on top of the substrate, and a first sinker of the first conductivity type extending from a surface of the additional semiconductor material to the isolation layer is formed. A second sinker of the second conductivity type extending from the surface of the additional semiconductor material to the second buried layer is formed. A first well implant of dopant of the second conductivity type into the additional semiconductor material above the second buried layer to form a first well is performed, the first well including the second sinker. Finally, a base region of the first conductivity type is formed within the first well, and an emitter of the second conductivity type is formed within the base region.

A bipolar device in accordance with one embodiment of the present invention comprises a semiconductor material of a first conductivity type having a surface, a well of the first conductivity type formed in the semiconductor material and having a bottom portion at a first depth in the semiconductor material, and an isolation layer of a second conductivity type opposite the first conductivity type positioned in the semiconductor material beneath the well. A buried collector layer of the first conductivity type is positioned in the bottom portion of the well above the isolation layer. A base region of the second conductivity type is positioned inside the well and extends from the surface of the semiconductor material to above the buried collector region, and an emitter of the first conductivity type is positioned within the base.

A better understanding of the features and advantages of the present invention will be obtained by reference to the following detailed description and accompanying drawings which set forth illustrative embodiments in which the principles of the invention are utilized.

DESCRIPTION OF THE DRAWINGS

FIGS. 4A–4F are cross-sectional views of the process steps for forming a portion of an IC utilizing lateral trench isolation and including a PNP bipolar transistor in accordance with the embodiment shown in FIG. 3.

DETAILED DESCRIPTION OF THE INVENTION

Figure 1:
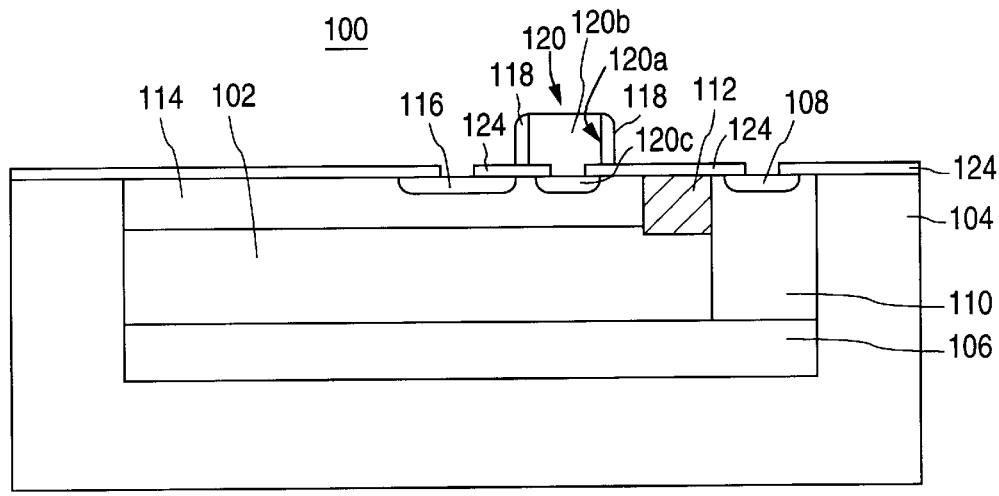
FIG. 1 is a cross-sectional view of a conventional PNP bipolar transistor.
Figure 2:
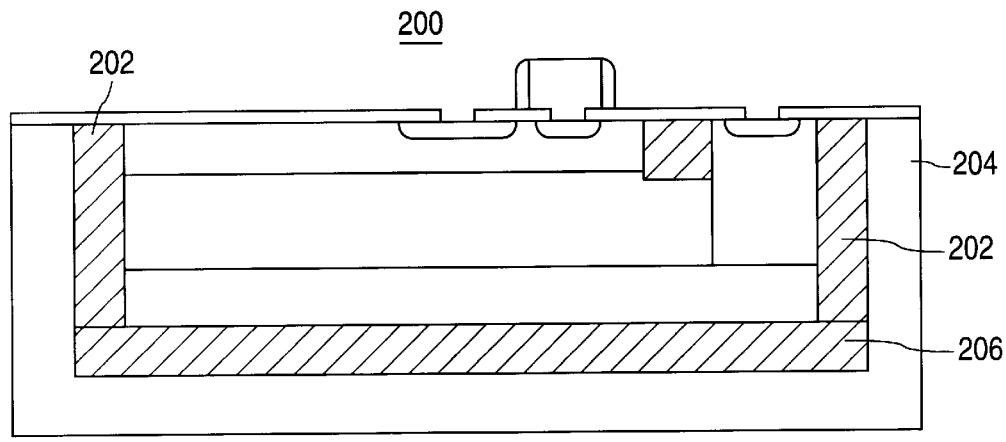
FIG. 2 is a cross-sectional view of a conventional PNP bipolar transistor utilizing silicon-on-insulator isolation.
Figure 3:
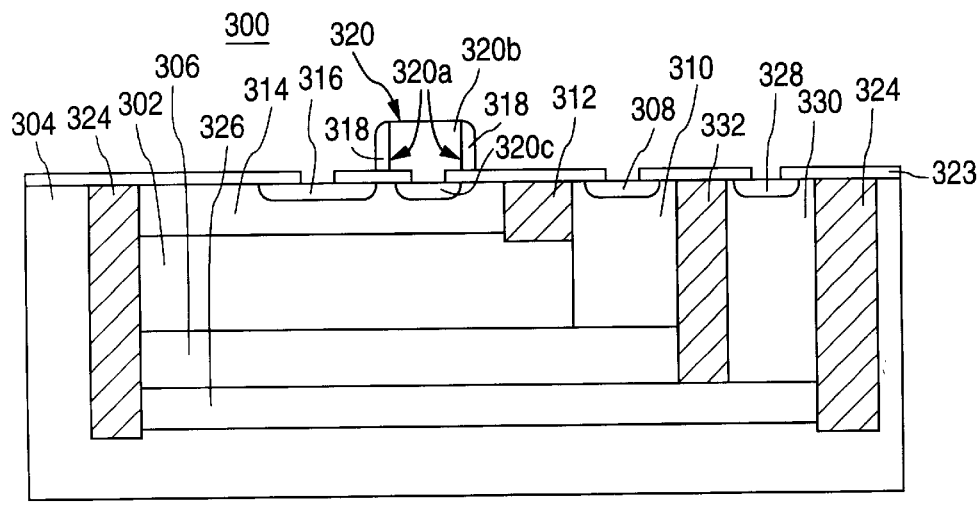
FIG. 3 is a cross-sectional view of a PNP bipolar transistor in accordance with one embodiment of the present invention.

FIG. 3 is a cross-sectional view of a PNP bipolar transistor in accordance with one embodiment of the present invention. PNP bipolar transistor 300 is created in P-well 302 that is formed within P-type silicon 304.

The collector of bipolar transistor 300 is formed from P-well 302 and buried P+ layer 306. Buried P+ layer 306 is connected to collector contact 308 by P+ sinker structure 310. Collector contact 308 and sinker 310 are electronically insulated from the base and emitter by intra-device isolation structure 312, which may be formed by LOCOS or trench isolation techniques.

The base of bipolar transistor 300 is formed by N-type layer 314 having N+ base contact region 316. N+ base contact region 316 is self-aligned to oxide spacer 318 formed on sidewall 320a of P+ diffused polysilicon emitter 320. Polysilicon emitter contact component 320b overlies single crystal emitter component 320c. Polysilicon emitter contact component 320b is separated from base 314 by portions of dielectric layer 323.

Bipolar transistor 300 is laterally isolated from surrounding devices by inter-device isolation structures 324, which may be formed using LOCOS or trench isolation techniques. Bipolar transistor 300 is vertically isolated from underlying P-type silicon 304 by N-type isolation layer 326.

N isolation layer 326 is connected to isolation contact 328 by N+ sinker 330. Isolation contact 328 is electrically isolated from the remainder of the device by second intra-device trench structure 332.

N isolation layer 326 accomplishes junction isolation of P-type collector comprising P-well 302 and P+ buried layer 306 from underlying P-type silicon 304. In this manner, the performance of transistor 300 remains virtually unaffected by changes in the bias of P-type silicon 304. Thus, because of N isolation layer 326, transistor 300 will not couple through the P-type silicon with adjacent semiconducting devices.

FIGS. 4A–4F are cross-sectional views of the process steps for forming a portion of an IC which includes the embodiment of the PNP bipolar transistor in accordance with the present invention shown in FIG. 3.

Figure 4A:
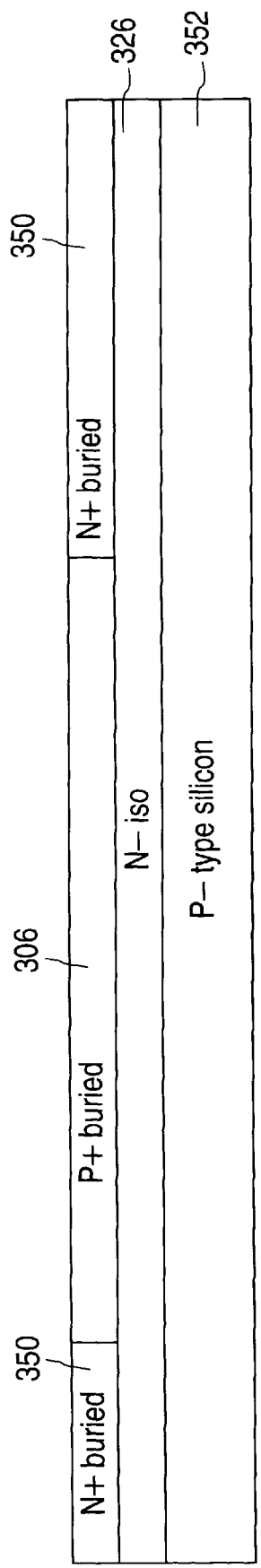

FIG. 4A shows the first phase of the process, wherein N-type dopant is blanket implanted into the surface of P-substrate 352 to form N-iso layer 326, followed by thermal drive-in. Next, the surface of P-substrate 352 is masked and N+ buried layer 350 is implanted into unmasked regions and then driven in. Finally, P+ buried layer 306 is ion implanted into the surface of substrate 352 utilizing a mask self-aligned to the N+ buried layer implant mask.

Figure 4B:
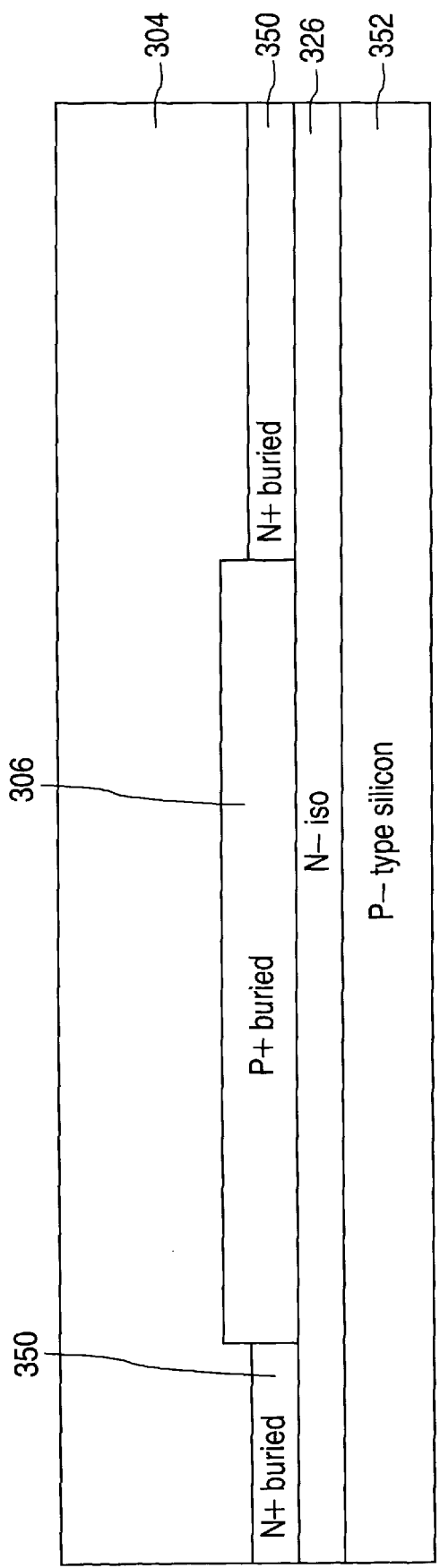

FIG. 4B shows the next step in the process, wherein epitaxial growth of silicon over P-type substrate 352 creates single crystal silicon layer 304. Dopant present in buried layers 306 and 350 diffuses upward during this epitaxial growth, with the lighter P-type dopant (boron) of P+ buried layer 306 migrating farther than the heavier N-type dopant (arsenic) of N+ buried layer 350.

FIG. 4C shows high energy implantation of large doses of N-type dopant into epitaxial silicon 304 in order to create N+ sinker structure 330 connecting N isolation layer 326 to the surface. Similarly, a large dose of P-type dopant is implanted into silicon 304 at high energy to create P+ sinker structure 310 connecting P+ buried layer 306 to the surface. Thermal drive in may be required for either or both of these ion-implantation steps, due to the necessary thickness of sinkers 310 and 330.

FIG. 4D shows self-aligned masking and implant of dopant to form contiguous N-wells 354 and P-well 302. P+ sinker 310 lies within P-well 302 and N+ sinker 330 lies within N-well 354. Again, thermal drive in of implanted dopant may be required to form either or both of wells 302 and 354.

Figure 4E:
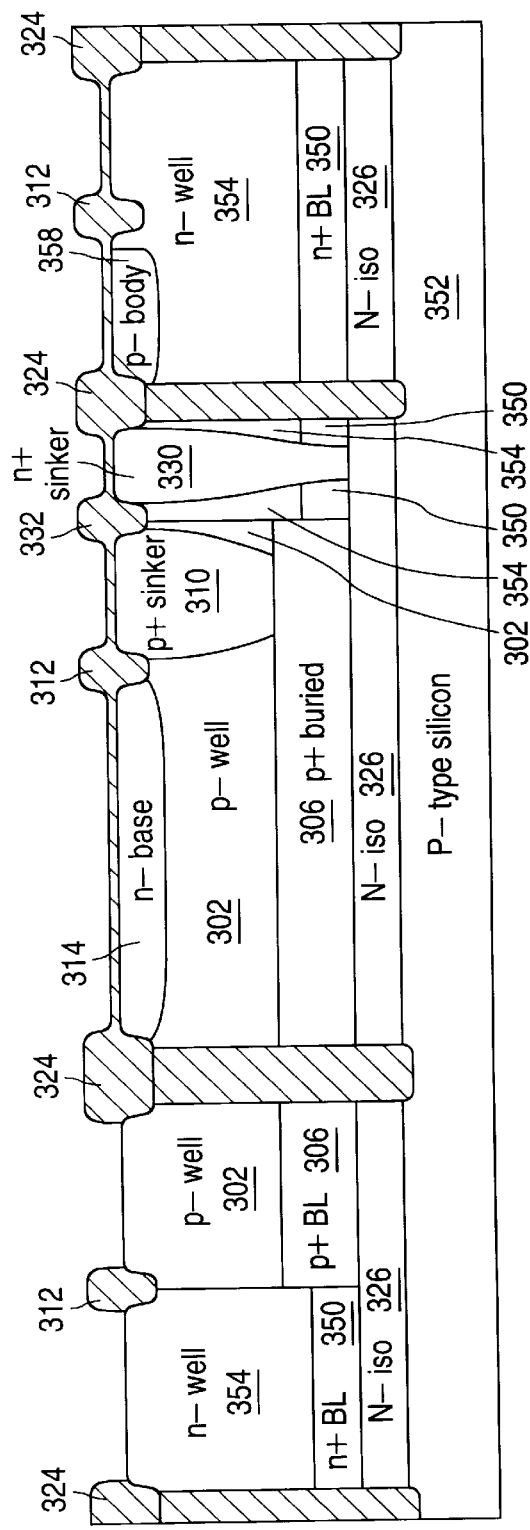

FIG. 4E shows the formation of inter- and intra-device isolation structures 324 and 312, respectively. FIG. 4E also shows implantation of dopant into surface regions of wells 302 and 354 to form base region 314 of the precursor bipolar device, also body region 358 of the precursor LDMOS device.

Adjacent semiconductor devices are laterally isolated from one another by dielectric-filled trenches 324 etched into the silicon below the maximum possible extent of the depletion region of N-iso layer 326. Portions of semiconductor devices are insulated from other electrically active regions by intra-device isolation structures 312. Although intra-device isolation structures 312 are shown in FIG. 4C as LOCOS structures, shallow trench isolation could also be utilized.

Figure 4F:
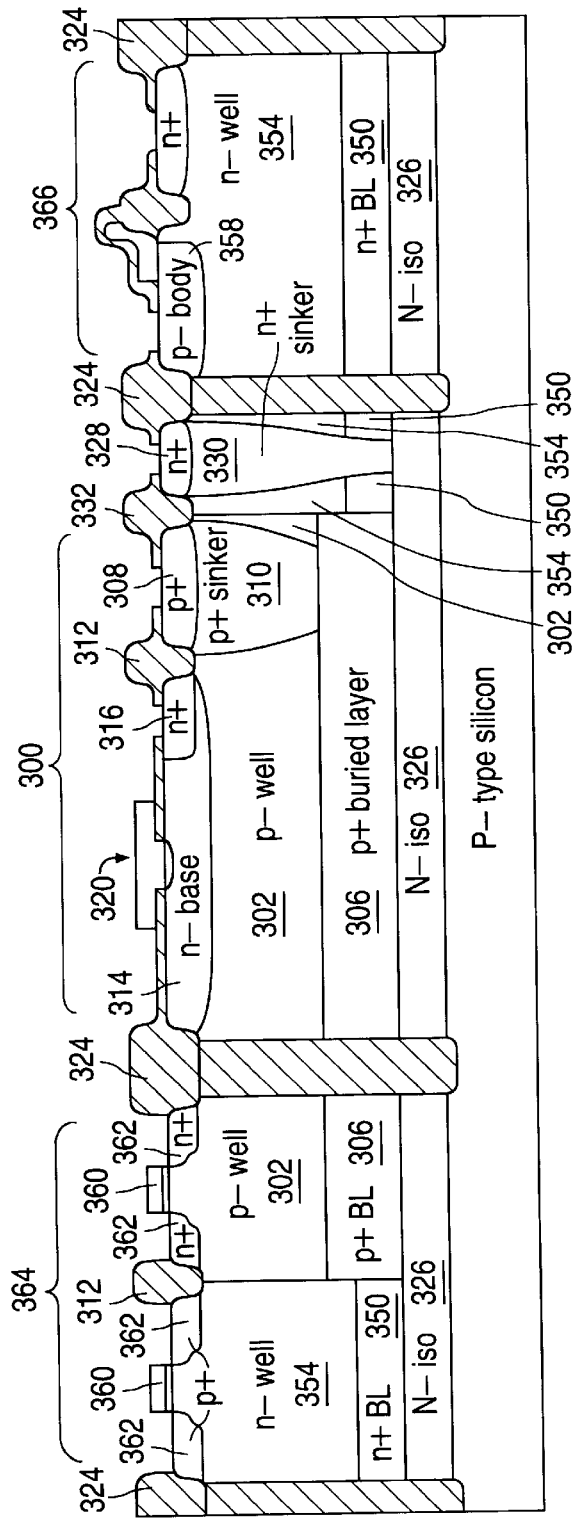

FIG. 4F shows completion of structures making up the IC, wherein diffused polysilicon emitter 320 of PNP bipolar transistor 300, gates 360 of CMOS devices 364, and the gate of LDMOS 366 are formed from polysilicon. Dopant of the first and second conductivity type is introduced into surface regions of wells 354 and 302 to form source/drain regions 362 of CMOS devices 364, base, collector, and isolation contact regions 316, 308, and 328, respectively of PNP device 300, and the source region of LDMOS 366. Body ties (not shown) permitting electrical contact with body regions of the MOS devices would also be formed during this step.

Although the invention has been described above in FIGS. 3–4F connection with one specific embodiment, it must be understood that the invention as claimed should not be unduly limited to this embodiment. Various modifications and alterations in the structure and process will be apparent to those skilled in the art without departing from the scope of the present invention.

For example, in a first alternative embodiment, an NPN bipolar transistor device that is vertically isolated utilizing junction isolation could be created in accordance with the present invention. Such an NPN transistor would feature a P type isolation layer beneath the N+ buried layer of the collector in an N-type substrate.

Figure 5:
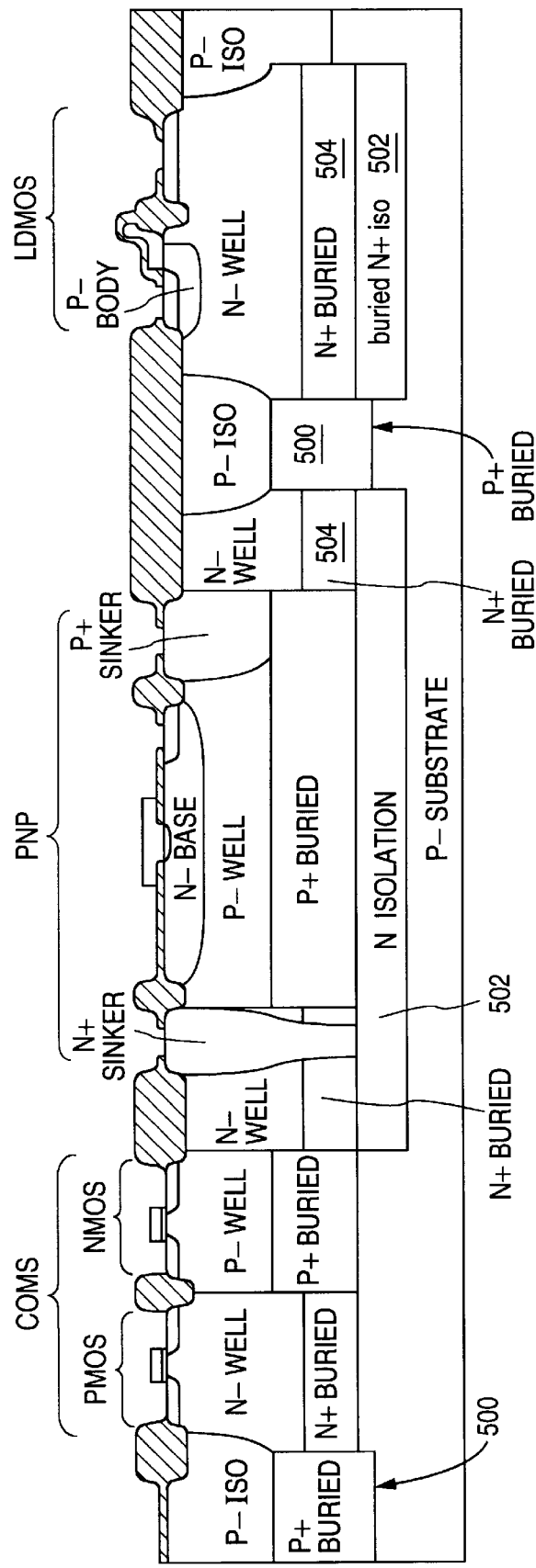
FIG. 5 is a cross-sectional view of a portion of an IC utilizing junction lateral isolation and including a PNP bipolar transistor in accordance with an alternative embodiment of the present invention.

In a second alternative embodiment of the present invention, FIG. 5 shows a cross-sectional view of a portion of an IC utilizing junction isolation and including a PNP bipolar transistor. P+ junction lateral isolation regions 500 (rather than dielectric-filled trenches) serve to laterally isolate the CMOS, bipolar, and LDMOS devices.

In the second alternative embodiment shown in FIG. 5, an additional masking step would be necessary to form buried N isolation layer 502, which must be excluded from underneath P+ lateral junction isolation regions 500. This is because the presence of N isolation layer 502 underneath P+ lateral junction isolation regions 500 would result in formation of an electrically conductive path between adjacent portions of N+ buried layer 504. As seen in FIG. 5, vertical isolation in accordance with the present invention is thus preferred where trenches are employed for lateral isolation.

In a third alternative embodiment of the present invention, the N+/P+ buried layer implants and/or the N/P well implants are not self-aligned to one another. Self-alignment of the N+ and P+ buried layer conserves process steps, but may be impractical in high voltage applications, where junctions between adjacent N+ and P+ buried layers could create unwanted parasitic Zener diodes.

Therefore, a process flow wherein the buried layers and/or the well regions are separately masked would also fall within the province of the present invention. In such an embodiment, adjacent devices would be laterally isolated by intervening lightly doped silicon that has been spared the introduction of dopant during both the N+ and P+ buried layer implant steps.

In a fourth alternative embodiment of the present invention, no epitaxial silicon is grown. The vertical isolation layer is created directly in the underlying substrate by high energy implantation, followed by highly doped buried layer formation and well formation.

In a fifth alternative embodiment of the present invention, a single tub architecture is utilized instead of the twin-tub architecture depicted in FIGS. 4A–5. In such an alternative embodiment, lightly doped epitaxial silicon outside of the single well performs the role of the second well, and includes the sinker region permitting electrical contact with the isolation layer.

Given the multitude of embodiments described above, it is intended that the following claims define the scope of the present invention, and that the methods and structures within the scope of these claims and their equivalents be covered hereby.

What is claimed is:

1. A process for forming a bipolar device comprising the steps of:

performing an isolation implant of dopant of a first conductivity type into a semiconductor substrate to form an isolation layer;

thermally driving the isolation implanted dopant into the substrate;

performing a first masked buried layer implant of dopant of the first conductivity type into the semiconductor substrate to form a first buried layer;

performing a second masked buried layer implant of dopant of the second conductivity type into the semiconductor substrate outside of the first buried layer to form a second buried layer;

creating additional lightly doped semiconductor material of the first conductivity type on top of the substrate;

forming a first sinker of the first conductivity type extending from a surface of the additional semiconductor material to the isolation layer;

forming a second sinker of the second conductivity type extending from the surface of the additional semiconductor material to the second buried layer;

performing a first well implant of dopant of the second conductivity type into the additional semiconductor material above the second buried layer to form a first well, the first well including the second sinker;

forming a base region of the first conductivity type within the first well; and forming an emitter of the second conductivity type within the base region.

2. The process according to claim 1 wherein the second masked buried layer implant is self-aligned to the first masked buried layer implant.

3. The process according to claim 1 further comprising the step of performing a second well implant of dopant of the first conductivity type into the additional semiconductor material outside of the first well to form a second well, the second well including the first sinker.

4. The process according to claim 3 wherein the second well implant is self-aligned to the first well implant.

5. The process of claim 1 wherein the semiconducting material is single crystal silicon, and the step of forming an emitter comprises forming a diffused polysilicon emitter, the diffused polysilicon emitter including a polysilicon contact component formed on the surface of the additional semiconductor material over the base region, and a single crystal emitter component formed within the base region.

6. A process for forming a bipolar device comprising the steps of:

performing a high energy implant of dopant of a first conductivity type into a semiconductor material to form an isolation layer at a depth in the semiconductor material;

performing a first masked buried layer implant of dopant of the first conductivity type into the semiconductor substrate to form a first buried layer above the isolation layer;

performing a second masked buried layer implant of dopant of the second conductivity type into the semiconductor substrate outside of the first buried layer to form a second buried layer above the isolation layer;

forming a first sinker of the first conductivity type extending from a surface of the semiconductor material to the isolation layer;

forming a second sinker of the second conductivity type extending from the surface of the semiconductor material to the second buried layer;

performing a first well implant of dopant of the second conductivity type into the semiconductor material above the second buried layer to form a first well, the first well including the second sinker;

forming a base region of the first conductivity type within the first well; and forming an emitter region of the second conductivity type within the base region.

7. The process according to claim 6 wherein the second masked buried layer implant is self-aligned to the first masked buried layer implant.

8. The process according to claim 6 further comprising the step of performing a second well implant of dopant of the first conductivity type into the semiconductor material above the first buried layer to form a second well, the second well including the first sinker.

9. The process according to claim 8 wherein the second masked well implant is self-aligned to the first well implant.

10. The process according to claim 6 wherein the semiconducting material is single crystal silicon, and the step of forming an emitter comprises forming a diffused polysilicon emitter, the diffused polysilicon emitter having a polysilicon emitter contact component formed on the surface of the semiconductor material over the base region, and having a single crystal emitter component formed within the base region.

* * * * *